United States Patent [19]

Bathaee

[11] Patent Number: 5,057,706
[45] Date of Patent: Oct. 15, 1991

[54] ONE-SHOT PULSE GENERATOR

[75] Inventor: Mehdi Bathaee, Riverside, Calif.

[73] Assignee: Western Digital Corporation, Irvine, Calif.

[21] Appl. No.: 656,776

[22] Filed: Feb. 15, 1991

Related U.S. Application Data

[63] Continuation of Ser. No. 555,816, Jul. 18, 1990, abandoned, which is a continuation of Ser. No. 290,331, Dec. 27, 1988, abandoned.

[51] Int. Cl.⁵ .................... H03K 3/284; H03K 3/017
[52] U.S. Cl. ................................ 307/273; 307/265; 307/451; 307/279; 307/234
[58] Field of Search ............... 307/234, 464, 265, 451, 307/273, 279; 328/110, 111

[56] References Cited

U.S. PATENT DOCUMENTS

| | | | |
|---|---|---|---|
| 3,431,021 | 1/1969 | Britt | 328/112 |
| 4,114,106 | 9/1978 | Martensson | 328/111 |
| 4,339,011 | 7/1982 | Di Marzio | 307/273 |
| 4,370,569 | 1/1983 | Hunsinger | 307/266 |
| 4,425,514 | 1/1984 | Orr et al. | 307/273 |
| 4,507,570 | 3/1985 | Mahabadi et al. | 307/273 |
| 4,760,279 | 7/1988 | Saito et al. | 307/234 |
| 4,800,295 | 1/1989 | Minuhin et al. | 307/273 |

Primary Examiner—Timothy P. Callahan
Attorney, Agent, or Firm—Christie, Parker & Hale

[57] ABSTRACT

A one-shot state machine circuit, preferably implemented exclusively with CMOS transistors, converts long state changes to pulses or one-shots with a fixed duration. A short signal stage to eliminate responses to short glitch signals and a majority gate inside an input state provide the one-shots in response to valid input signals. An output stage mediates conflicting signals from the short signal stage and the majority gate.

5 Claims, 4 Drawing Sheets

PULSE GENERATOR - 10

INPUT SIGNAL SHORTER THAN 5 ns

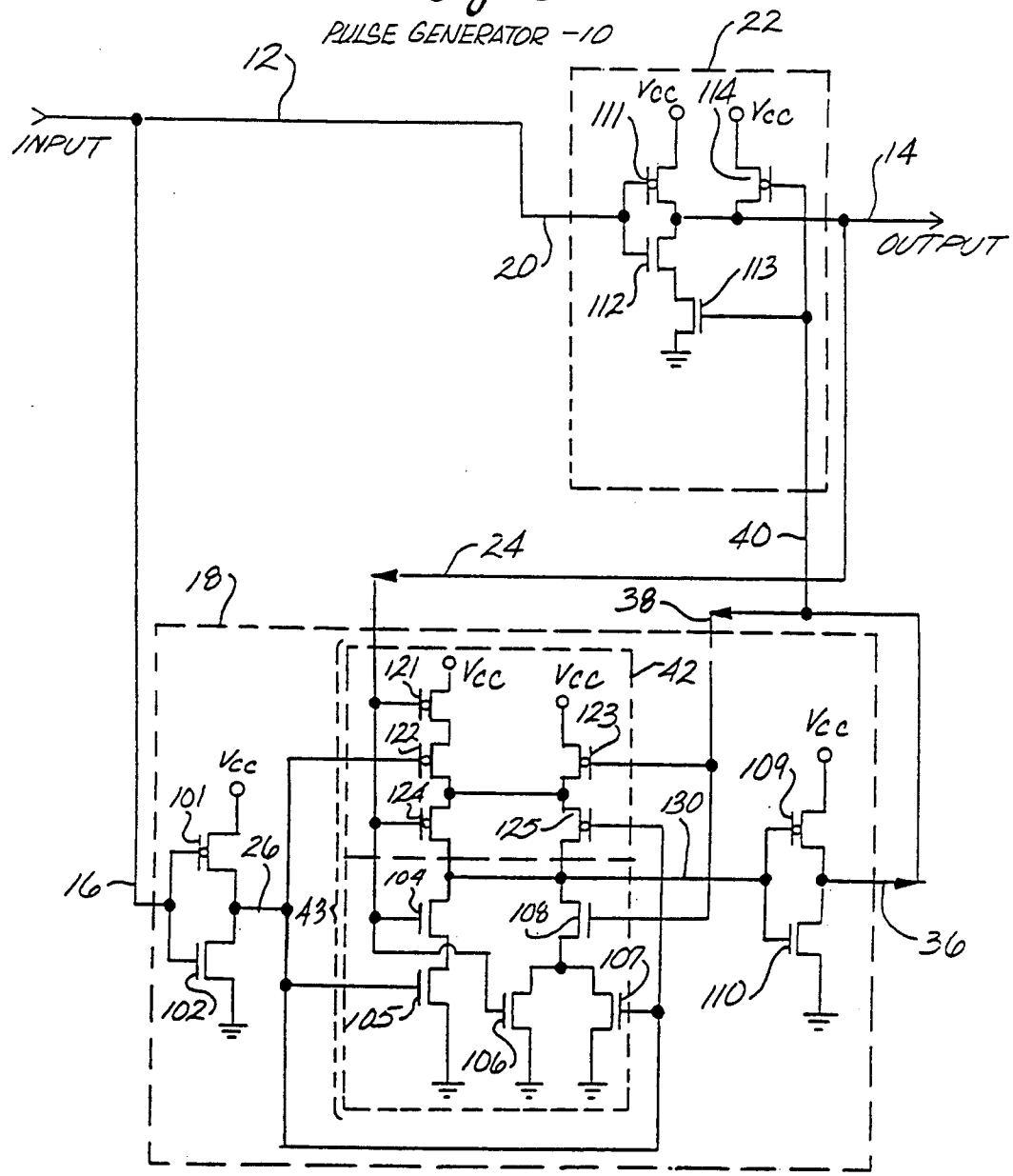

ONE-SHOT PULSE GENERATOR

CROSS-REFERENCE TO RELATED APPLICATIONS

This is a continuation of application Ser. No. 07/555,816 and 07/290,331, filed Jul. 18, 1990 and Dec. 27, 1988, now abandoned.

FIELD OF THE INVENTION

This invention pertains to the field of one-shot circuits and, more particularly, to a more reliable one-shot circuit.

BACKGROUND OF THE INVENTION

It is often necessary in digital circuitry to generate a pulse of defined length in response to a pulse of undefined length. This is frequently done with a delay line loop and a two input logic gate, for example, a NAND or a NOR gate.

In such a typical circuit, the circuit input receives the undefined pulse. It is coupled both to one of the inputs of the logic gate and to the delay line. The delay line typically uses either a long odd numbered string of inverters or a capacitor based delay circuit. The other end, or output end of the delay line, is connected to the other input of the logic gate. Assuming the circuit input is normally low and a NAND gate is used, when the circuit input goes high, it will cause the NAND gate output to go low, and it will cause a delay to propagate through the delay line towards the other input of the NAND gate. When the delay reaches the NAND gate, it causes the NAND gate to go high again.

In this way, the circuit converts the long pulse into a short pulse or one shot. The length of the short pulse is determined by the built-in time delay in the delay line. If only inverters are used, then the delay is determined by the time it takes for the signals to propagate through the usually semiconductor materials from which the inverters are made. If the delay line is capacitor based, then the delay is typically determined by the time constant of the resistor capacitor circuit.

While these prior circuits effectively generate one-shot pulses, they do have some drawbacks. First, the electronic circuitry, which provides the input to the one-shot circuit, can provide a variety of different inputs. Some are legitimate signals and some are short glitches or erroneous signals. Prior circuits have not been able to distinguish between legitimate and erroneous signals. In addition, many prior circuits use both active and passive elements. Normally, the passive elements are capacitors. When the circuit is subject to changing environmental conditions and changing loads, the passive and active elements respond differently. As a result, the parameters of the circuit change and its behavior is unreliable.

SUMMARY OF THE INVENTION

The present invention overcomes these shortcomings of the prior art and is readily adapted to integrated circuit implementations. In its preferred embodiment, it is a state machine constructed entirely of active semiconductor elements, transistors, and can distinguish between different types of inputs. In addition, it operates asynchronously using a majority gate so no clock is needed.

The invention includes an input stage and an output stage. The output stage provides a one shot signal to downstream circuitry, the duration of which is fixed by an intermediate signal from the input stage. The input stage produces the intermediate signal after a delay, the duration of which is determined by the time required for the input signal to propagate through active semiconductor elements.

In another embodiment, the present invention includes an input stage including a majority gate for generating an intermediate signal in response to an input signal after a delay, the duration of which is determined by the time required for the input signal to propagate through the active semiconductor elements of the majority gate. It also includes an output stage for providing an output signal having a fixed duration determined by the intermediate signal. A short signal stage connected between the input stage and the output stage provides a second intermediate signal after a second shorter delay which inhibits the output stage from providing an output signal in response to short input signals.

BRIEF DESCRIPTION OF THE DRAWINGS

FIG. 5 is a circuit diagram showing an alternative embodiment of the present invention without a glitch filter.

DETAILED DESCRIPTION OF THE INVENTION

Figure 1:
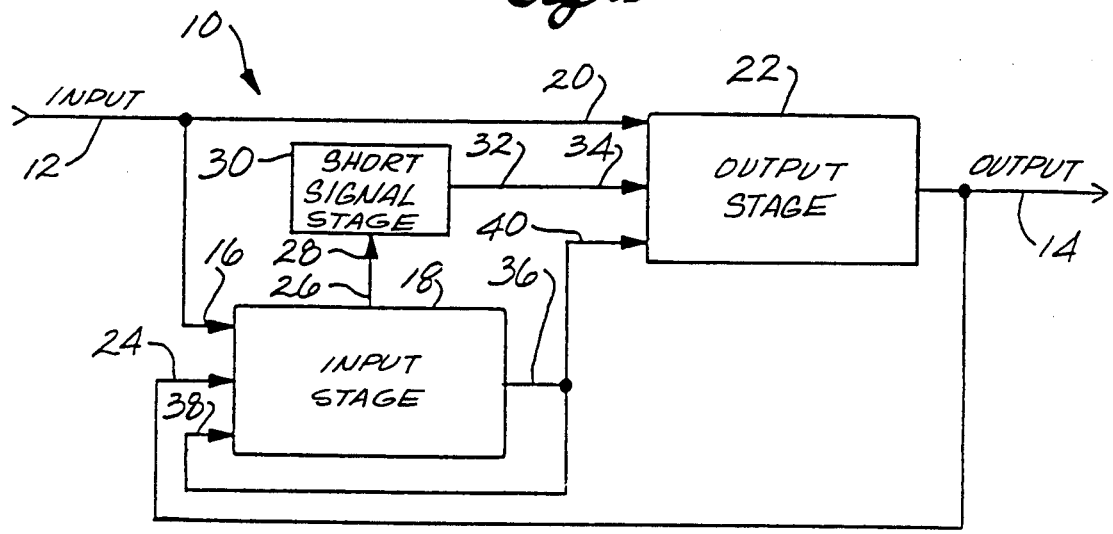
FIG. 1 is a block diagram of a preferred embodiment of the present invention.

FIG. 1 shows the present invention in an exemplary embodiment. The variable pulse generator circuit 10 has a circuit input 12 and a circuit output 14, each preferably a single conductor. The circuit input 12 is connected to a first input 16 of an input stage 18 and to a first input 20 of an output stage 22. The circuit output 14 is connected to a second input 24 of the input stage 18. The input stage 18 has an intermediate output 26 which is connected to an input 28 of a short signal stage 30. An output 32 of the short signal stage 30 is connected to a second input 34 of the output stage 22. A final output 36 of the input stage 18 is connected both to a third input 38 of the input stage 18 and a third input 40 to the output stage 22.

Figure 2:
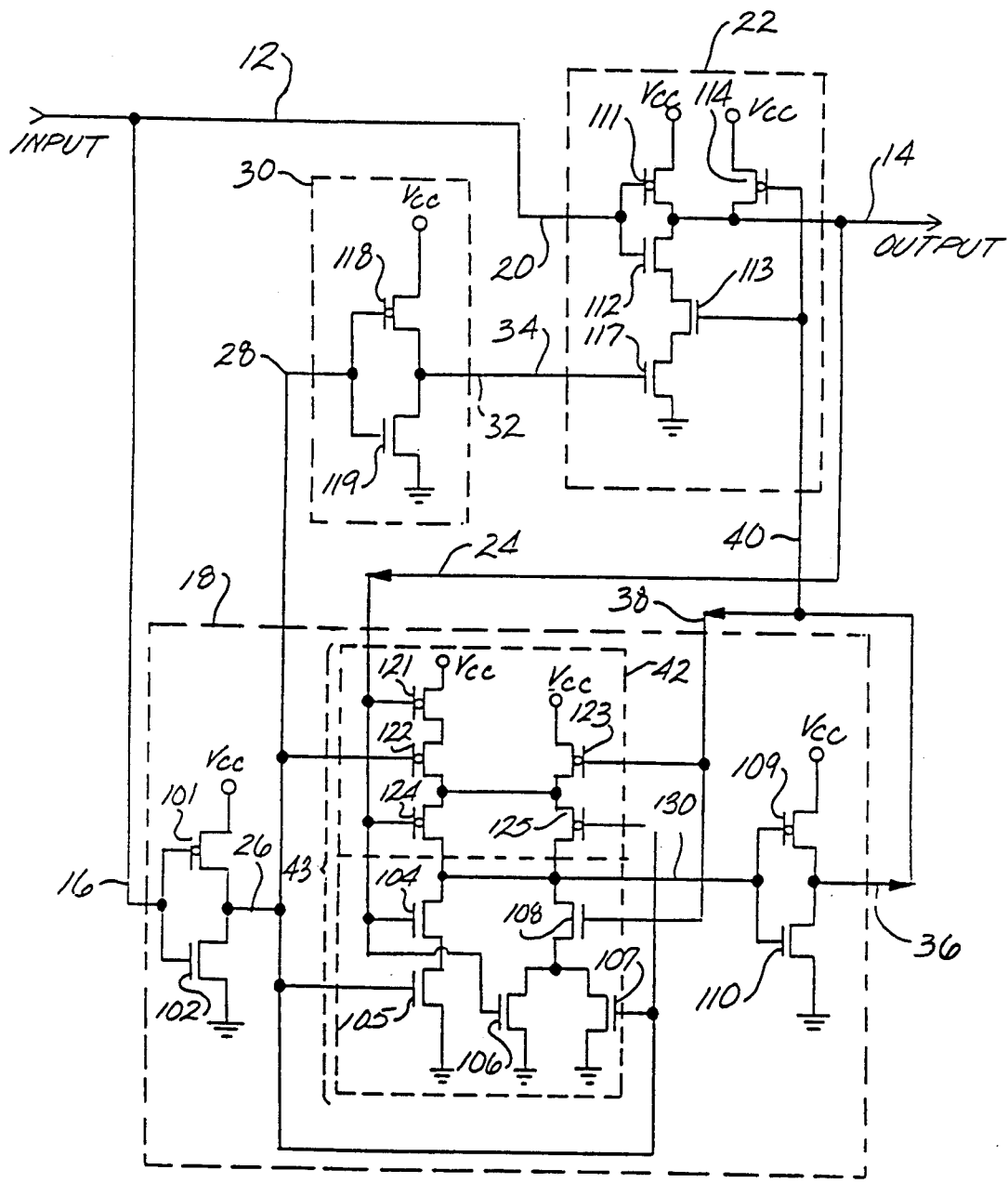
FIG. 2 is a circuit diagram showing a transistor implementation of the circuit of FIG. 1.

FIG. 2 shows a preferred embodiment of the various stages of FIG. 1. As will be seen, the input stage 18 preferably includes a majority gate and two inverters. The short signal stage 30 is preferably, an inverter. The embodiment of FIG. 2 uses complementary metal oxide semiconductor (CMOS) transistors. P-channel transistors are indicated with a circle between the gate and drain and n-channel transistors are indicated without. The high potential sources VCC and grounds shown in FIGS. 2 and 5 are preferably all common.

Circuit input 12 constitutes the input 20 to the output stage 22. Within the output stage 22 is a string of four CMOS transistors. The source of the first transistor 111 in the string is connected to a high potential, and its gate is connected to the first input 20. The drain of the first transistor 111 is connected to the circuit output 14 and to the source of the second transistor, an n-channel transistor 112. The gate of the second transistor 112 is connected to the first input 20 and its source is connected to the drain of a third transistor 113, an n-channel transistor. The gate of the third transistor 113 is connected to the third input 40 to the output stage 22 and its drain is connected to the drain of the fourth an n-channel transistor 117. The gate of the fourth transistor is connected to the second input 34 to the output stage 22 and its source is connected to ground. The output stage 22 has another p-channel transistor 114, the source of which is connected to the high potential VCC, the gate of which is connected to the third input 40 to the output stage 22 and the drain of which is connected to the circuit output 14.

The circuit input 12 is also connected to the first input 16 of the input stage 18. The input 16 connects first to a two transistor inverter. The source of the first, a p-channel transistor 101, is connected to the high potential VCC. The gate is connected to the first input 16, and the drain is connected to the drain of the second, an n-channel transistor 102. The gate of the second transistor is connected to the first input 16, and the source is connected to ground. The output of the inverter is formed by the junction between the drain of the first transistor and the drain of the second transistor. This is also the intermediate output 26 of the input stage 18.

The intermediate output 26 of the input stage 18 connects to the input 28 to the short signal stage 30. The short signal stage 30 is made up of a two transistor inverter identical to that just described. The junction between the drains of a p-channel transistor 118 and an n-channel transistor 119 in the inverter is connected to the output 32 of the short signal stage 30. This output, as described above, is connected to the gate of the fourth transistor 117 in the output stage 22.

The intermediate output 26 of the inverter, made up of transistors 101 and 102, also connects to a serial string of five transistors within the input stage. The source of the first, a p-channel transistor 121 is connected to the source of high potential VCC. The gate of the first transistor is connected to the second input 24 to the input stage. The drain of the first transistor is connected to the source of the second, another p-channel transistor 122. The gate of the second transistor is connected to the intermediate output 26 of the input stage 18. The drain of the second transistor is connected to the source of the third, another p-channel transistor 124. The gate of the third transistor 124 is connected to the second input 24, and the drain of the third transistor 124 is connected to the drain of the fourth, an n-channel transistor 104. The gate of the fourth transistor 104 is also connected to the second input 24, and the source is connected to the drain of the fifth, another n-channel transistor 105. The gate of the fifth transistor 105 is connected to the intermediate output 26, and the source is connected to ground.

This string of five transistors, 121, 122, 124, 104, 105, is linked to another string of five transistors. The first, a p-channel transistor 123, is connected at its source to the source of high potential VCC. The gate of transistor 123 is connected to the third input 38 to the input stage. The drain of the first transistor 123 is connected to the source of the second, a p-channel transistor 125, and to the junction between the drain of transistor 122 and source of transistor 124. The gate of the second transistor 125 is connected to the intermediate output 26 of the input stage 18 and the drain of transistor 125 is connected to the drain of the fourth, an n-channel transistor 108, and to the drain of transistor 104. The gate of transistor 108 is connected to the third input 38 of the input stage 18 and the drain is connected to the drains of two different transistors in parallel, the first, an n-channel transistor 106 has its gate connected to the second input 24 of the input stage and its source connected to ground, and the second, another n-channel transistor 107 has its gate connected to the intermediate output 26 of the input stage and its source connected to ground. The drains of transistors 124, 104, 108 and 125 are connected to another two transistor inverter, within the input stage. The inverter is made up of a p-channel transistor 109 connected to high and an n-channel transistor 110 at ground. The output of this inverter is the final output 36 of the input stage 18. As can be seen from FIG. 2, transistors 121, 122, 123, 124 and 125 form a pull-up circuit 42.

Figure 3A:
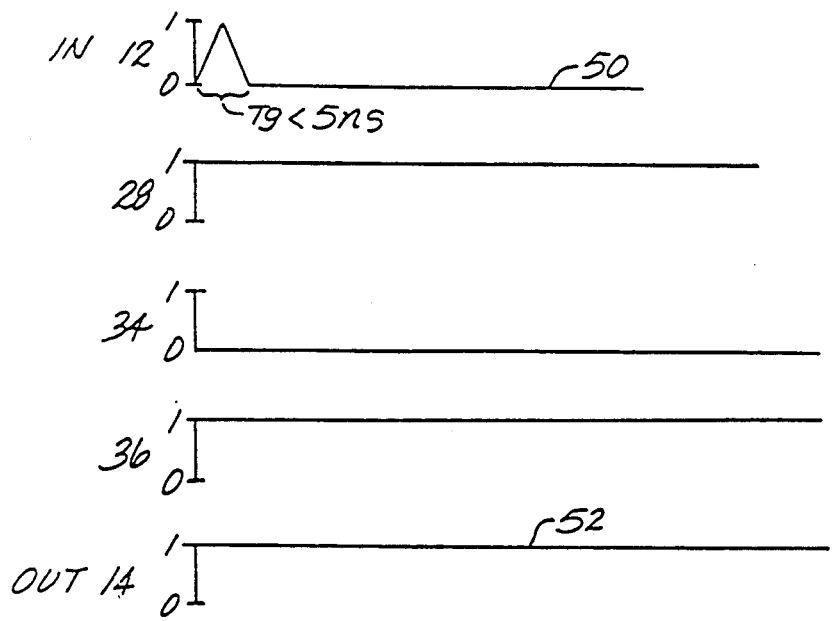
FIG. 3A is a timing diagram of an input to the circuit of FIG. 2 and its resultant output where the input is a glitch.

FIG. 3 shows graphic representations of two possible inputs to the circuit of FIG. 2 and their resultant outputs. In FIG. 3A, the input waveform 50 is a short signal, a spurious spike or glitch. These short signals are generated in many different ways, but almost always reflect noise or random errors caused by some glitch in the circuitry upstream of the pulse generator. It does not contain information intended to be transmitted to the circuitry downstream of the pulse generator. The output 52 in response to such a glitch is completely flat. That is, there is no response.

Figure 3B:
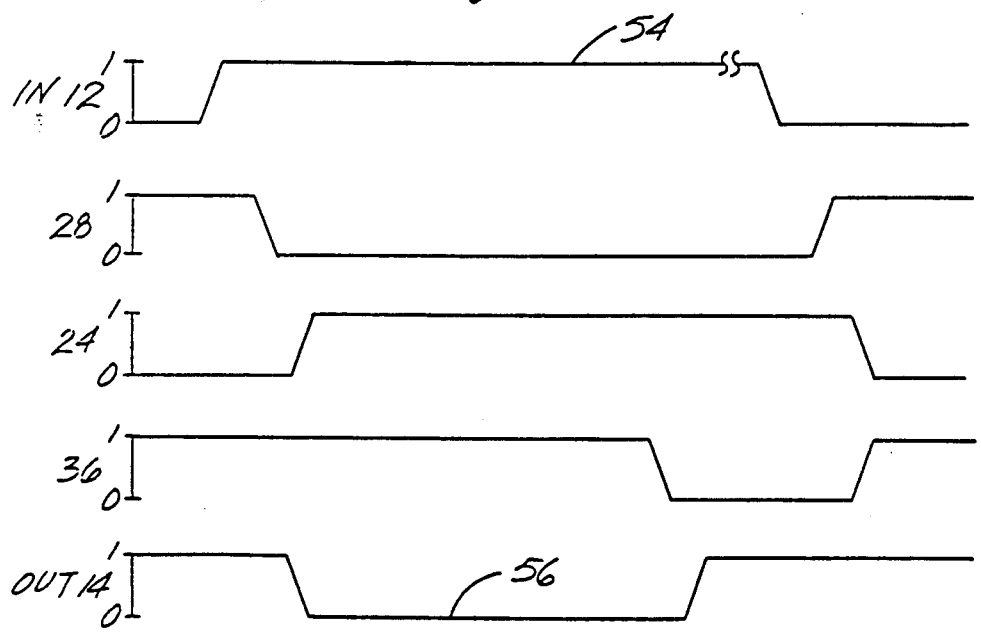
FIG. 3B is a timing diagram of an input to the circuit of FIG. 2 and its resultant output where the input is a true state transition.

In FIG. 3B, the input signal 54 is a long transition from a low state to a high state. While the length of the transition is not crucial, it must be substantially longer than the input signal of FIG. 3A. Typically, such a state transition would be generated by some upstream electrical device in order to signal some downstream device through the pulse generator circuit. The output signal 56 in response to the long state transition is a pulse of known width. In FIG. 3B the width of the pulse is indicated as $t_a$ which is twenty nanoseconds (ns).

The operation of the pulse generator relies on the input stage 18 which includes a majority gate. The input stage provides inputs to the output stage 22. Table 1 is a truth table for the input stage. The three inputs 16, 24, and 38 to the input stage 18 are indicated as either a one (high) or a zero (low). The corresponding output 36 is indicated below each set of inputs. There is an inherent delay $t_a$ from the time that the inputs to the majority gate change until the output changes. This delay is determined by the construction of the transistors. In the present example, this delay $t_d$ has been chosen to be twenty ns. Table 2 is a truth table for the output stage 22 in the same format as Table 1. The output stage responds to input changes comparatively quickly.

The majority gate input stage in combination with the output stage form a state machine based on sequential not combinational logic. The generator is preferably made entirely of asynchronous elements so that no clock input need be provided. The sequential logic is inherently self-timing partly because of the feedback inputs 24 and 36 to the majority gate 18.

TABLE 1

| Truth Table for Input Stage 18 | | | | | | | | |
|---|---|---|---|---|---|---|---|---|
| First Input 12, 16 | 0 | 0 | 0 | 0 | 1 | 1 | 1 | 1 |

TABLE 1-continued

| Truth Table for Input Stage 18 | | | | | | | | |
|---|---|---|---|---|---|---|---|---|
| Second Input 24 | 0 | 0 | 1 | 1 | 0 | 0 | 1 | 1 |
| Third Input 38 | 0 | 1 | 0 | 1 | 0 | 1 | 0 | 1 |
| Output 36 | 0 | 0 | 0 | 1 | 0 | 1 | 1 | 0 |

TABLE 2

| Truth Table for Output Stage 22 | | | | | | | | | |
|---|---|---|---|---|---|---|---|---|---|
| First Input 12, 16 | 0 | 0 | 0 | 0 | 1 | 1 | 1 | 1 | 1 |
| Second Input 24 | 0 | 0 | 1 | 1 | 0 | 0 | 1 | 1 | 1 |
| Third Input 40 | 0 | 1 | 0 | 1 | 0 | 1 | 0 | 0 | 1 |
| Output 14 | 1 | 1 | 1 | 1 | 1 | 0 | 1 | 1 | 0 |

Figure 4:
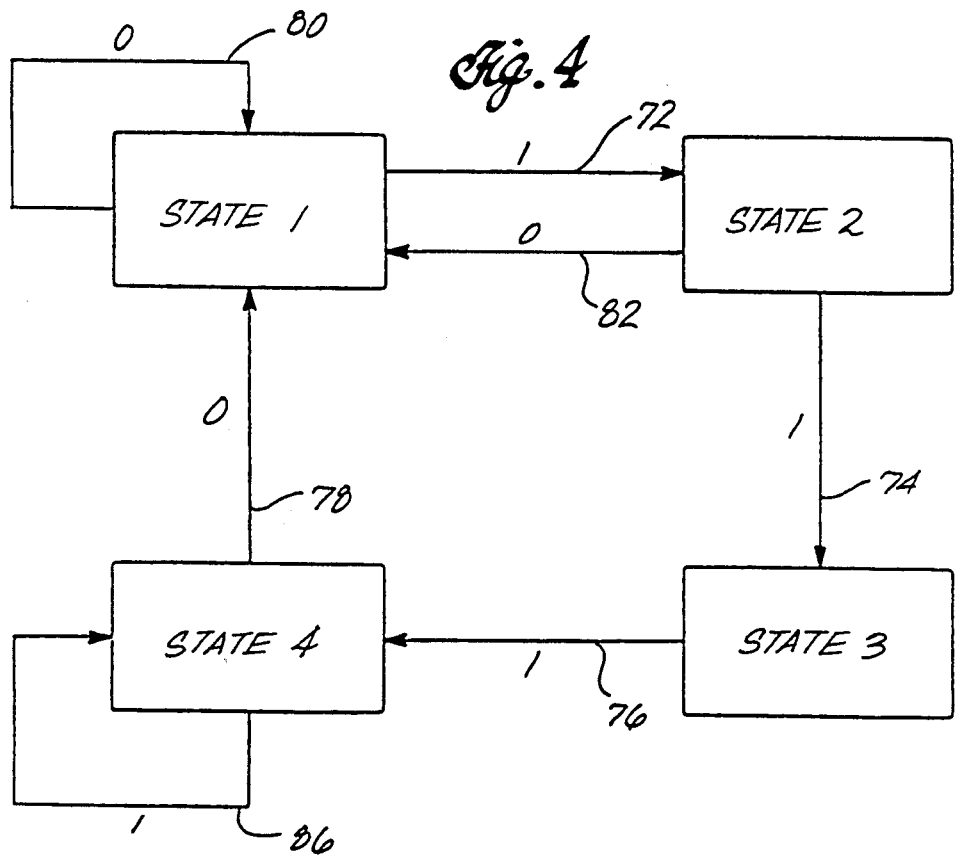
FIG. 4 is a sequential state flow diagram showing the state transitions of the present invention in response to changes in the input.

FIG. 4 is a sequential state flow diagram that illustrates the operation of the embodiments of FIGS. 1 and 2. Arrows 72, 74, 76, 78, 80, 86 indicate the transitions which occur in response to a change in the state of the input 12 to the circuit. The state of the input is indicated beside each arrow as a 1 (high) or a 0 (low). As will be described in greater detail below, stage one is the reset stage. When the circuit is in stage one, the circuit parameters are all known. The circuit goes to stage two when any detectable signal is received at the circuit input 12 that is, when the input goes high. In stage three the circuit provides a memory and the delay. The transition to stage three occurs when a signal is produced at the circuit output 14. The circuit goes to stage four when the output returns to its normal high state after the one shot is transmitted. The transition back to stage one occurs when the input pulse ends that is, when the input goes low.

The circuit begins its operation in stage one, a stable state. The circuit is stable and reset when the circuit input 12 is low, the circuit output 14 is high, and the output 36 of the input stage 18 is high. The level of these inputs and outputs as either high or low as well as the states of several of the transistors of the circuit of FIG. 2 as either on or off are indicated in the timing diagram of FIG. 6. From stage one, the circuit operates in one of two different modes. The first is the glitch detection mode corresponding to FIG. 3A. The second is the normal mode of FIG. 3B. The glitch detection mode will be discussed first. In stage one, the second input 34 to the output stage 22 is low so that transistor 117 is disabled. As long as the input 12 does not change, the circuit remains in stage one as indicated by arrow 80 (FIG. 4). When a short signal or glitch 50 occurs and the circuit input 12 goes high, the circuit transitions to stage two, as indicated by arrow 72 (FIG. 4). The state of the input 12 causes input 20 to the output stage 22 to be high. However, the state of the output 14 cannot switch to low until the gate of transistor 117 is opened. As illustrated in FIG. 6A, transistor 117 will be enabled and output 14 will go low only after the high transition of the input 12 propagates through transistors 101, 102, 118, 119 and 117 (FIG. 6). The time required for the transition to propagate through these transistors is a function of the construction of the transistors. In this exemplary embodiment, this time $t_g$ (FIG. 3) is chosen to be approximately five ns, which is longer than most anticipated glitches. As a result, there will be no transition to low at the output 14 for five ns. If, as indicated by dashed lines in FIG. 6A, the high input at 12 is a glitch no longer than five ns, then the input 12 will go back to low, enabling transistor 111 and maintaining output 14 high before transistor 117 is enabled and causes the output 14 to go low. As a result, output 14 will stay high and the glitch will not be transmitted to the downstream circuitry. The circuit goes from stage two back to stage one, indicated by arrow 82 (FIG. 4) without producing an output pulse. Glitches are eliminated simply and with only a slight delay, greatly enhancing the reliability of any noise laden system which incorporates the present invention.

In the normal operating mode, a long valid signal is received at input 12 as indicated in FIG. 3B. If a stable transition to a high state 54 caused by a legitimate signal occurs at the circuit input 12, the circuit first transitions to stage two (FIG. 4). Then, after a five ns delay, the circuit goes to stage three, and the output 14 will transition to low through transistors 101, 102, 118, 119, 117, 111, 112, and 113. The propagation of the signals through these transistors is indicated in FIG. 6A by solid lines.

The new low signal at the output 14 is fed back as the third input 24 to the input stage 18, where it enables the pull-up path 42 of the input stage 18 through transistors 121, 124, 109 and 110. This switches the input stage output 36 from high to low. The input stage output 36 is fed to the third input 40 of output stage 22, causing transistors 113 and 114 to switch, and the circuit output 14 is switched back to high. This is the transition to stage four indicated by the arrow 76. The time delay between stage three and stage four depends on the construction of the transistors and may be varied to suit particular applications. This delay determines the length of the output pulse. A twenty ns delay $t_d$ is depicted in FIG. 3B, by way of example, from the time the output switches from high to low until it switches back to high because of the feedback loop.

After some time, the circuit input 12 changes back to a low state. This enables transistor 111 of the output stage 22 thereby maintaining a high state at the output 14 and eventually, through the other transistors, resetting the circuit. This transition back to stage one is indicated by arrow 78 (FIG. 4). As indicated by arrow 86, the transition back to stage one does not occur until the input 12 changes. Accordingly, a second one-shot pulse is not produced at the output 14 until the input 12 transitions and, after a short delay, the circuit resets to stage one.

It is presently preferred that the pulse generator be implemented as an integrated circuit (IC) using techniques well known in the art. Much of the operation of the circuit relies on signal propagation delays through the short signal stage 30 and the input stage 18. When making ICs, the time required for signals to propagate through the semiconductor elements can be adjusted by varying the dimensions of each transistor with a variety of the techniques well known in the art. However, other techniques for adjusting the propagation delays may be used as well.

Many variations and modifications may be made to the present invention without departing from its spirit and scope within the scope of the claims hereof. For example, the transistors indicated as CMOS may be constructed in some other way, or replaced with equivalent elements. In addition, if several one-shot circuits are required, the transistor count can be reduced by using Wilson current sources. If the glitch elimination feature is not desired, then the transistor count may be further reduced by eliminating transistors 118, 119, and 117 and the associated connecting lines. The output stage is then a NAND gate which uses the input 12 and the output 36 of the input stage 18 as its inputs, as shown in FIG. 5. Also, any of the polarities indicated here may be reversed and any state indicated here as high may be replaced with a low state provided appropriate changes are made in the circuitry and environment.

What is claimed is:

1. A one shot pulse generator circuit for receiving an input signal and for asynchronously generating a constant width output pulse independent of the width of the input signal when the input signal is of a predetermined level for at least a predetermined time duration, the combination comprising:

a delay circuit responsive to the input signal at a predetermined level for providing a delayed signal commencing after said predetermined time duration following the beginning of the input signal of predetermined level;

an output stage having first, second and third inputs and an output, the output stage being characterized in that it is responsive to the presence of both the input signal of predetermined level at its first input and the delayed signal at its second input for beginning the output pulse at its output; and a majority gate comprising an output coupled to the third input of the output stage, a first input coupled to the input signal, a second input coupled to the output of the output stage and a third input coupled to the output of the majority gate, the majority date being characterized by a predetermined delay characteristic and being responsive to the presence of the output pulse for changing the output of the majority gate from a first output signal to a second output signal after the predetermined delay following the presence of the output pulse, the output stage responding to the second output signal for terminating the presence of the output pulse, the majority gate being responsive to both the absence of the input signal of predetermined level and the output pulse for changing the signal at the output of the majority gate from the second to the first output signal, the output stage being responsive to the presence of the second output signal from the majority gate for preventing the formation of a further output pulse until such second output signal terminates.

2. The one shot of claim 1 wherein the output stage comprises a first switching circuit for clamping the output of the output stage to a first voltage level during the presence of the output pulse and a second switching circuit for clamping the output of the output stage to a second voltage level when the output pulse is not present.

3. The one shot of claim 1 wherein the input of the delay circuit and the first input of the majority gate are coupled together so that each substantially simultaneously receives a signal corresponding to the presence of the input signal of predetermined level.

4. The one shot of claim 1 comprising an inverter circuit having an input coupled to the input signal and an output coupled to the first input of the delay circuit and to the first input of the majority gate.

5. The one shot of claim 1 comprising an inverter coupled between the output of the majority gate and the third input of the output circuit.

* * * * *

UNITED STATES PATENT AND TRADEMARK OFFICE
CERTIFICATE OF CORRECTION

PATENT NO. : 5,057,706

DATED : October 15, 1991

INVENTOR(S) : Mehdi Bathaee

It is certified that error appears in the above-identified patent and that said Letters Patent is hereby corrected as shown below:

Title page, item

[56] Refs. Cited, U.S. PATENT DOCUMENTS,
change "3,431,021" to -- 3,421,021 --.

Abstract, line 6, change "state" to -- stage --.

Column 3, line 11, after "fourth" delete "an".

Column 7, line 30, change "date" to -- gate --.

Signed and Sealed this

Twentieth Day of April, 1993

Attest:

MICHAEL K. KIRK

*Attesting Officer*       *Acting Commissioner of Patents and Trademarks*